United States Patent
Xie

(10) Patent No.: US 9,660,528 B2
(45) Date of Patent: May 23, 2017

(54) ADAPTIVE CONTROLLER FOR A VOLTAGE CONVERTER

(71) Applicant: TEXAS INSTRUMENTS INCORPORATED, Dallas, TX (US)

(72) Inventor: Jianzhang Xie, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 14/631,178

(22) Filed: Feb. 25, 2015

(65) Prior Publication Data

US 2016/0118889 A1 Apr. 28, 2016

Related U.S. Application Data

(63) Continuation of application No. PCT/CN2014/089451, filed on Oct. 24, 2014.

(51) Int. Cl.
*H02M 3/158* (2006.01)
*H02M 1/00* (2006.01)
*H02M 1/08* (2006.01)

(52) U.S. Cl.
CPC ......... *H02M 3/158* (2013.01); *H02M 3/1588* (2013.01); *H02M 1/08* (2013.01); *H02M 2001/0054* (2013.01); *Y02B 70/1466* (2013.01); *Y02B 70/1491* (2013.01)

(58) Field of Classification Search
CPC .............................. H02M 3/156; H02M 3/1588
USPC ......................................... 323/222, 271, 282
See application file for complete search history.

(56) References Cited

U.S. PATENT DOCUMENTS

| 6,259,614 | B1* | 7/2001 | Ribarich | H02M 1/4225 323/222 |
| 6,690,144 | B1* | 2/2004 | DeNicholas | G05F 1/10 323/222 |
| 6,768,655 | B1* | 7/2004 | Yang | H02M 1/4225 323/222 |
| 7,812,576 | B2* | 10/2010 | Sutardja | G05F 1/70 323/222 |

(Continued)

FOREIGN PATENT DOCUMENTS

| CN | 101071981 A | 11/2007 |
| CN | 101459381 A | 6/2009 |

(Continued)

OTHER PUBLICATIONS

PCT Search Report Application No. PCT/CN2014/089451, dated Jul. 22, 2015 (3 pages).

*Primary Examiner* — Jeffrey Sterrett

(74) *Attorney, Agent, or Firm* — William B. Kempler; Charles A. Brill; Frank D. Cimino

(57) ABSTRACT

A DC-to-DC converter includes an input voltage node, an inductor, and a switch coupled to the inductor and the input voltage node. More specifically, the switch has an on state and off state, wherein during the on state, current flowing through the inductor increases and the off state results in a decrease of the current flowing through the inductor via a driver coupled to the switch. The driver comprises a plurality of transistors and an adaptive voltage node, wherein a voltage level at the adaptive voltage node is to vary in accordance with the current flowing through the inductor so as to decrease a variation of the amount of time to turn off the switch.

7 Claims, 2 Drawing Sheets

(56) References Cited

U.S. PATENT DOCUMENTS

| | | | | |
|---|---|---|---|---|
| 8,232,780 B2* | 7/2012 | Uno | ................... | H02M 1/4225 |
| | | | | 323/222 |
| 8,320,144 B2* | 11/2012 | Lee | ..................... | G05F 1/70 |
| | | | | 323/207 |
| 8,773,111 B2* | 7/2014 | Nishikawa | .......... | H02M 1/4225 |
| | | | | 323/222 |
| 2010/0090671 A1* | 4/2010 | Zhang | ................... | G05F 1/565 |
| | | | | 323/283 |
| 2010/0188784 A1* | 7/2010 | Young | ................. | H02M 3/156 |
| | | | | 361/18 |
| 2011/0075448 A1* | 3/2011 | Melanson | ............ | H02M 3/156 |
| | | | | 363/20 |
| 2011/0211377 A1* | 9/2011 | Uno | ................... | H02M 1/4225 |
| | | | | 363/124 |
| 2011/0254524 A1* | 10/2011 | Ishii | .................... | H02M 3/156 |
| | | | | 323/282 |
| 2012/0268090 A1* | 10/2012 | Sasaki | ................. | H02M 3/158 |
| | | | | 323/271 |
| 2013/0336017 A1 | 12/2013 | Uno et al. | | |
| 2014/0210548 A1 | 7/2014 | Shi et al. | | |
| 2016/0072384 A1* | 3/2016 | Fan | ..................... | H02M 3/156 |
| | | | | 323/282 |
| 2016/0118889 A1* | 4/2016 | Xie | ..................... | H02M 3/158 |
| | | | | 323/271 |

FOREIGN PATENT DOCUMENTS

| | | |
|---|---|---|
| CN | 101937014 A | 1/2011 |
| CN | 102891598 | 1/2013 |

\* cited by examiner

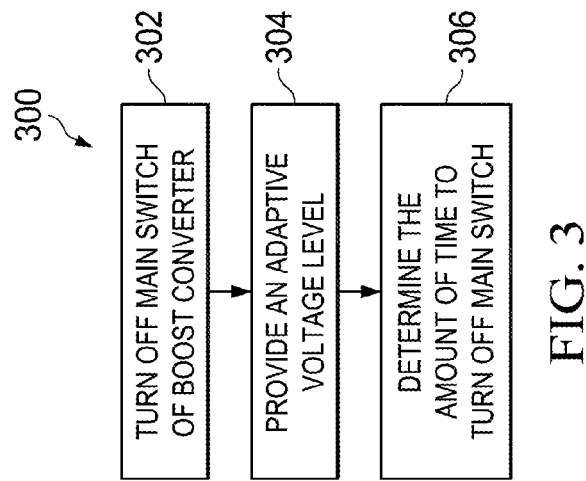
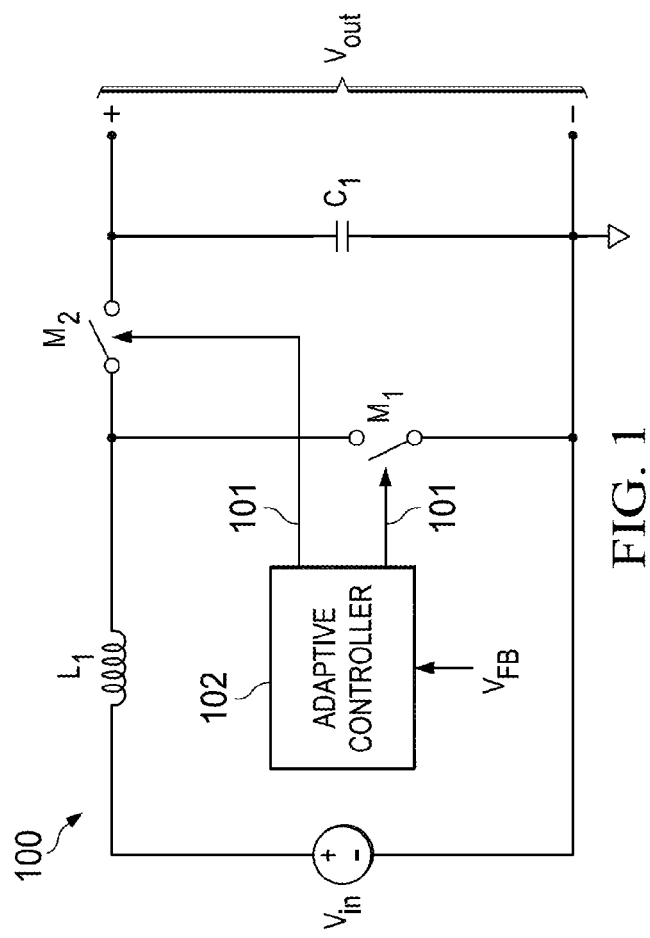

ADAPTIVE CONTROLLER FOR A VOLTAGE CONVERTER

CROSS-REFERENCE TO RELATED APPLICATION

This is a continuation of copending International Application No. PCT/CN2014/089451, with an international filing date of Oct. 24, 2014, which designated the United States and is hereby fully incorporated herein by reference for all purposes.

BACKGROUND

A switched-mode DC-to-DC boost converter generally includes at least two semiconductor devices as switches (e.g., a transistor as a switch and a diode or a transistor as a synchronous switch). Switching on and off the semiconductor switch more efficiently may advantageously increase efficiency of the DC-to-DC boost converter as a whole.

SUMMARY

Systems and methods to decrease a variation of the amount of time to turn off a switch of a DC-to-DC boost converter are disclosed herein. In an embodiment, a DC-to-DC converter includes an input voltage node, an inductor, and a switch coupled to the inductor and the input voltage node. More specifically, the switch has an on state and off state, wherein during the on state, current flowing through the inductor increases and the off state results in a decrease of the current flowing through the inductor via a driver coupled to the switch. The driver comprises a plurality of transistors and an adaptive voltage node, wherein a voltage level at the adaptive voltage node is to vary in accordance with the current flowing through the inductor so as to decrease a variation of the amount of time to turn off the switch.

In another embodiment, a DC-to-DC converter includes a first switch coupled to an input voltage node and an inductor, a second switch coupled to the inductor and an output voltage node, and a driver coupled to the first and second switches and configured to alternately turn on and off the first and second switches. More specifically, while the first switch is on, the first switch is configured to increase current that flows through the inductor. While the second switch is on, the second switch is configured to decrease the current that flows through the inductor. While the first switch is off, the driver is to provide a voltage level to an adaptive voltage node, the voltage level being inversely proportional to the current that flows through the inductor so as to decrease a variation of the amount of time to turn off the first switch.

In a further embodiment, a method includes turning off a main switch of a DC-to-DC converter so as to decrease current flowing through an inductor coupled to an input voltage node and the main switch, based on the current flowing through the inductor, providing a voltage level at an adaptive voltage node being inversely proportional to the current flowing through the inductor, and based on the voltage level at the adaptive voltage node, determining the amount of time to turn off the main switch.

BRIEF DESCRIPTION OF THE DRAWINGS

For a detailed description of exemplary embodiments of the invention, reference will now be made to the accompanying drawings in which:

FIG. 1 shows a block diagram to illustrate a DC-to-DC boost converter including an adaptive controller in accordance with various embodiments;

FIG. 3 shows a method to determine the amount of time to switch off a main switch of a DC-to-DC boost converter in accordance with various embodiments.

NOTATION AND NOMENCLATURE

Figure 2:
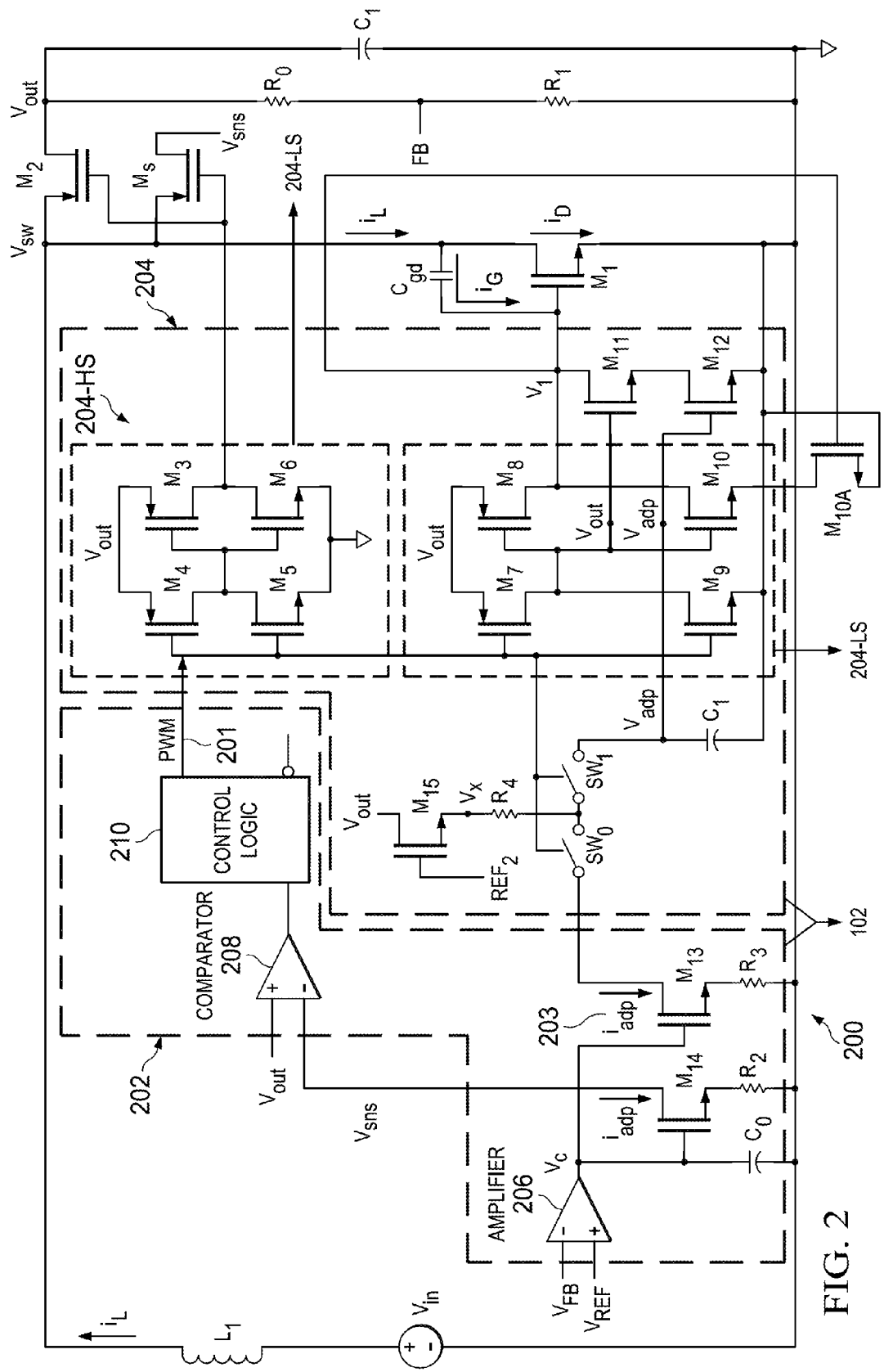
FIG. 2 shows a further illustration of an adaptive controller in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A boost converter is used to generate a higher output voltage based on lower input voltage source. Thus, an input voltage source from, for example, a battery may be received by a direct current-to-direct current (DC-to-DC) boost converter and boosted to a desired voltage necessary for powering various electrical components that require a particular regulated voltage.

Generally, a switched-mode boost converter includes at least two semiconductor devices (e.g., a diode and/or a transistor) and at least one energy storage element, (e.g., a capacitor, an inductor). In the boost converter, the semiconductor devices may be configured as switches that turn on and off alternately so as to regulate the input voltage to the desired output voltage. More specifically, turning on and off the switches may be controlled via a driver, or a controller, coupled to the switches.

In an example, a boost converter preferably includes a first transistor (e.g., a metal-oxide-semiconductor field-effect transistor (MOSFET) or a bipolar junction transistor (BJT)) functioning as a low-side switch and a second transistor functioning as a high-side switch. The low-side switch is coupled to an inductor and ground, and the high-side switch is coupled to the output (preferably a load of the converter) and an inductor. Typically, the low-side and high-side switches are controlled via a pulse width modulated (PWM) signal that is provided by a controller coupled to the switches. The PWM signal is a time-varying square wave that transitions alternately between a lower level and a higher level. The alternate transition results in an alternate switching on and off the low-side and high-side switches.

Continuing with the above example, while the PWM signal is at the higher level, the low-side switch may turn on and remain on until the PWM signal transitions form the higher level to the lower level which causes the low-side switch to turn off. Concurrently, while the low-side switch is off, the high-side switch is on. More specifically, when the low-side switch is on, the input voltage source forms a short circuit with the inductor and the low-side switch to ground. Therefore, current flows through the inductor which results in storing energy within the inductor by generating a magnetic field. When the low-side switch is off, the magnetic field collapses and in turn the stored energy in the inductor flows through the high-side switch to a load (e.g., an output capacitor coupled at the output voltage node) of the voltage converter. Ideally, if a switching of the low-side and high-side switches is fast enough, a switching loss can be neglected and the voltage converter is able to maintain a constant voltage level at the output voltage node wherein the voltage level at the output voltage node is higher than the input voltage.

However, in practice, while the switch, especially the low-side switch, is being switched on and off, a switching loss due to the "Miller time" may disadvantageously cause power loss, and in turn, may affect a performance of the voltage converter, such as efficiency. Generally, the Miller time results from an unintentional discharging path of the switch. For example, if a MOSFET is implemented as the switch, the MOSFET includes a parasitic capacitance crossing between drain and gate terminals of the MOSFET. This parasitic capacitance thus induces a leakage current, or gate current, which may increase the amount of time that the switch needs to turn on or off. Conventionally, a circuit is coupled to the switch, and configured to tune (e.g., reduce) the Miller time. However, such conventional circuits generally include a fixed voltage node coupled to the gate terminal of the MOSFET switch, which may cause the Miller time to vary significantly in accordance with varying inductor current. In other words, a large variation of the Miller time with the inductor current may be present. The variation of the Miller time during the high-side switch being switched off may be especially significant, and undesirable.

As will be explained below, embodiments of the invention are directed to a DC-to-DC converter that comprises an adaptive controller coupled to switches of the converter. The adaptive controller further includes an adaptive voltage node that is usable to provide an adaptive voltage level that changes in accordance with the magnitude of the inductor current. By implementing the adaptive controller, the variation of the Miller time changing with the inductor current during switching off the low-side switch may be reduced. Also, a shorter amount of time to switch off the low-side switch advantageously may be achieved by implementing the disclosed adaptive controller in a DC-to-DC converter. The DC-to-DC converter, preferably a DC-to-DC boost converter according to the present disclosure, operates using the disclosed adaptive controller as shown and described below with respect to FIG. 2. Other architectures are possible as well.

FIG. 1 shows a top-level block diagram illustrating a DC-to-DC boost converter 100 in accordance with various embodiments. The boost converter 100 includes an input voltage source $V_{in}$, an inductor L1, an output voltage node $V_{out}$, an output capacitor C1, an adaptive controller 102, and two switches M1 and M2. More specifically, the adaptive controller 102 is configured to receive a feedback signal (e.g., $V_{fb}$) from the output voltage node $V_{out}$, and based on the feedback signal (e.g., a current and/or voltage signal), the adaptive controller 102 provides a PWM signal 101 to alternately switch on and off the switches M1 and M2. In a preferred embodiment, the switch M1 is referred to as the low-side switch, and the switch M2 is referred to as the high-side switch that operates time-exclusively with the low-side switch M1. In other words, while the switch M1 is on, the switch M2 is generally off, and vice versa—the switches are not both on at the same time.

As mentioned above, while the low-side switch M1 is on, the input voltage source $V_{in}$, the inductor L1, and the switch M1 forms a short circuit. Thus, energy starts to store inside the inductor L1 and current flowing through the inductor L1 increases. While the switch M1 is off, the energy stored inside the inductor L1 starts to discharge and the current flows through the inductor L1 to a load (e.g., the output capacitance C1) of the boost converter 100, resulting in a decrease of the inductor current.

Still referring to FIG. 1, while the switch M1 is being turned off via the PWM signal, depending on the current flowing through the inductor L1, the switch M1 may not be instantly turned off due to the effect of Miller time. In this regard, the adaptive controller 102 includes a circuit to tune a speed to turn on and off (i.e., varying the Miller time) with respect to the current flowing through the inductor L1 so as to actually turn off the switch M1 in a shorter period of time. In an example, the amount of time to turn off the switch M1 may be inversely proportional to the load current (i.e., the current flowing through the inductor L1), that is, the lower the load current the longer the amount of time to turn off the switch M1. Moreover, a large variation of the amount of time to turn off the switch M1 may be present. As such, this may not be desirable for a boost converter 100 under low-current condition and/or a wide range of load current conditions. More specifically, if it is intended to operate the boost converter 100 under a condition in which only a low level of current is preferred, the boost converter may be subject to an efficiency issue while the switch M1 transitions from on to off.

FIG. 2 shows an exemplary circuitry 200 of the boost converter 100 in accordance with various embodiments. As shown in FIG. 2, the adaptive controller 102 further includes two blocks 202 and 204. More particularly, block 202 is configured to receive the feedback signal $V_{fb}$ from the output voltage node $V_{out}$, and based on the feedback signal, provide the PWM signal 201 to further control the switches M1 and M2, and to provide adaptive current $i_{adp}$ 203 that is proportional to the inductor current to block 204. Based on the adaptive current 203, block 204, which is coupled to block 202, is configured to provide an adaptive voltage node $V_{adp}$, which is useful to control the speed (i.e., Miller time) for turning off the switch M1. Moreover, the circuitry 200 further includes a sense controller, MS, coupled to the high-side switch M2. The sense controller MS is configured to sense a voltage/current level (e.g., $V_{sns}$) at a common node $V_{sw}$ connected to the high-side switch M1 and low-side switch M2.

In accordance with a preferred embodiment, as shown in the circuitry 200, the boost converter 100 further includes a voltage divider (i.e., R0 and R1) that is used to divide the voltage level at the output voltage node $V_{out}$ and cause the feedback signal $V_{fb}$ to equal the divided signal. That is, $V_{fb}$ is less than the voltage level at the output voltage node $V_{out}$ and based on a voltage divider ratio of the resistors (e.g., R1/(R0+R1)). In an alternate embodiment, if a lack of the voltage divider may be preferred by a user to implement the boost converter 200, the feedback signal $V_{fb}$ equals the voltage level at the output voltage node $V_{out}$.

Still referring to FIG. 2, block 202 further includes an error amplifier 206, a comparator 208, and a control logic 210. The error amplifier 206 includes two input terminals configured to receive signals form $V_{fb}$ and a reference voltage $V_{ref}$ respectively. Together with a capacitor C0 coupled to the output of the error amplifier, the error amplifier 206 is configured to provide the adaptive current $i_{dap}$ that is proportional to the inductor current. As shown in FIG. 2, the adaptive current is preferably to flow through each of the transistors M14 and M13. Further, the comparator 208 is configured to compare $V_{out}$ and $V_{sns}$ so as to cause the coupled control logic 210 to produce a corresponding PWM signal that has a duty cycle to synchronously control a switching behavior of the switches M1 and M2.

Continuing with FIG. 2, block 204 further includes a constant voltage node Vx, a sample-and-hold circuit (e.g., SW0 and SW1) coupled to the constant voltage node Vx, a high-side driver 204-HS coupled to the high-side switch M2, and a low-side driver 204-LS coupled to the low-side switch M1. The drivers 204-LS and 204-HS are configured to buffer the received PWM signal and increase a driving speed of the low-side and high-side switches respectively. Preferably, M4 and serially connected M5 function as a first inverter of the high-side driver 204-HS, and M3 together with M6 functions as a second inverter connected in series with the first inverter. Analogously, for the low-side driver 204-LS, M7 and M9 forms a first inverter and M8 and M10 forms a second inverter connected in series with the first inverter. In a preferred implementation, M1~M10 are MOSFETs. Still in a preferred embodiment, the low-side driver 204-LS may further include a MOSFET M10A that is coupled to the M10. As shown in FIG. 2, a gate terminal of the M10A is connected to a voltage node V1, wherein the voltage node V1 is connected to a gate terminal of the low-side switch M1.

More specifically, the low-side driver 204-LS further includes an adaptive driving circuit coupled to the first and second inverters, wherein the adaptive driving circuit includes two transistors M11 and M12 and the switch M1. As shown in the circuitry 200, a drain terminal of the transistor M11 is connected to a gate terminal of the switch M1, and a gate terminal of the transistor M11 is coupled to the output voltage node $V_{out}$ via the transistor M8. The transistor M12 is connected serially to a source terminal of the transistor M11, and a gate terminal of the transistor M12 is connected to the adaptive voltage node $V_{adp}$.

In accordance with a preferred embodiment, while the switch M1 is being turned off, all of the inductor current (i.e., $i_L$ as shown in 200) flows through the switch M1 to ground. More specifically, since the switch M1 is preferably to operate in the saturation region of a MOSFET, a barely changing conductance current $i_D$ is present. Thus, based on the current law, $i_L=i_D+i_G$, how fast (i.e., the speed for the switch M1 to be off) the current through M1 goes to zero may largely depends on a variation of $i_G$, wherein $i_G$ is discharging current flowing through the parasitic capacitance $C_{gd}$ of the switch M1 to the serially connected transistor M11 and M12. Transistors M11 and M12 preferably operate in the linear region of a MOSFET. Further, the discharging current $i_G$ may be derived as, $V_{gs\_M1}/(R_{on\_M11}+R_{on\_M12})$, where $V_{gs\_M1}$, $R_{on\_M11}$, $R_{on\_M12}$ respectively represent a voltage drop across the gate and source terminals of the switch M1, a conductive resistance for the transistors M11 and M12. During switching off of the switch M1, $V_{gs\_M1}$ equals $V_{th}+K\sqrt{i_L}$, wherein $V_{th}$ is a threshold voltage of the switch M1 and K is a proportional constant. Still further, since the gate terminal of transistor M11 is coupled to the output voltage node $V_{out}$ that is approximately constant, resulting in an approximately constant value of the conductive resistance $R_{on\_M11}$. On the other hand, the gate terminal of transistor M12 is coupled to the adaptive voltage node $V_{adp}$ that changes in accordance with the inductor current $i_L$, and thus the conductive resistance $R_{on\_M12}$ may be derived as $$K\frac{1}{V_{adp}-V_{th}}.$$

In a preferred embodiment, the adaptive voltage node $V_{adp}$ may be controlled via selecting a value of a resistance R4 connected to the constant voltage node $V_x$, that is $V_{adp}=V_x-Ki_LR_4$.

Additionally, while the switch M1 is being turned off, M10 and M10A may increase a speed to discharge $i_L$, especially when a voltage level at the voltage node $V_1$ is higher than the voltage level at the gate terminal of the low-side switch M1 to cause the switch M1 to operate in a saturation mode. More specifically, with decreasing the voltage level at the gate terminal of the switch M1, M1 and M10A will switch from linear region to saturation region, meanwhile M12 may take over the function to discharge the inductor current $i_L$.

In summary, via selecting the value of the resistance R4 in accordance with the inductor current under which a user is intended to operate the boost converter 100, the variation of the speed varying with the inductor current may be optimized. Also, the amount of time to switch off the switch M1 may be reduced by the optimized value of resistance R4. Once the value of R4 is determined, the voltage level at the adaptive voltage node $V_{adp}$ is determined in accordance with the inductor current $i_L$. Based on the equation, Vgs_M1/(Ron_M11+Ron_M12), described above, the speed and the variation of the speed may be may be optimally tuned by the user for a suitable application.

Still referring to the circuitry 200, SW0 and SW1 are configured to simultaneously switch on and off so as to sample a voltage level and hold the sampled voltage level to produce the adaptive voltage, $V_x-Ki_LR_4$. More specifically, when the switches are on, SW0 and SW1 are coupled to the constant voltage node $V_x$. When the switches are off, SW0 and SW1 are coupled to the adaptive voltage node $V_{adp}$. To integrate the switches SW0 and SW1 with capacitor C1, an undesired DC current consumption while the switch M1 is off may be avoided.

FIG. 3 shows a flow chart 300 to determine the amount of time to switch off the switch M1 of the boost converter 100 in accordance with various embodiments. The flow chart 300 starts in block 302 with turning off the main switch (i.e., the low-side switch M1) of the boost converter 100. In a preferred embodiment, turning off the main switch may be controlled by the PWM signal provided by the adaptive controller 102. While the switch M1 is being turned off, the inductor current flows through the switch M1 and the coupled low-side driver 204-LS to ground, wherein the coupled low-side driver 204-LS preferably functions as a discharging path for the current $i_G$.

The flow chart 300 continues in block 304 with providing the voltage level at the adaptive voltage node, $V_{adp}$, to be inversely proportional to the inductor current. The adaptive voltage node is preferably coupled to the gate of the transistor of the low-side driver 204-LS. As such, the conductive resistance of the transistor M12, which is preferably one of the parameters to determine the amount of time to switch off the main switch M1, varies with the inductor current as well.

Based on the voltage level at the adaptive voltage node $V_{adp}$, in block 306, the amount of time to switch off the main switch M1 is determined by maintaining the gate terminal of the transistor M11 as the voltage level at the output voltage node $V_{out}$. As such, the conductive resistance of the transistor M11 changes very little if at all with the inductor current. In a preferred example, the amount of time to switch off the main switch M1 majorly depends on how fast the current $I_G$ goes to zero (i.e., how much the current $I_G$ goes through the discharging path including the transistors M11 and M12). More specifically, a characteristic (e.g., conductive resistance) of the transistor (e.g., M12) changes with the voltage level at the adaptive voltage node. Thus, providing the adaptive voltage node to change its voltage level in accordance with the inductor current may advantageously determine the speed to switch off the main switch M1.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A DC-to-DC converter, comprising:
 a first switch coupled to an input voltage node and an inductor, wherein the first switch if on, is configured to increase current that flows through the inductor;
 a second switch coupled to the inductor and an output voltage node, wherein the second switch if on, is configured to decrease the current that flows through the inductor; and
 a driver coupled to the first and second switches and configured to alternately turn on and off the first and second switches, wherein the driver includes two transistors connected in series, wherein the amount of time to turn off the first switch is based on a value of a conductive resistance from each of the two transistors, and a voltage drop between gate and source terminals of the first switch;
 wherein, while the first switch is off, the driver is to provide a voltage level to an adaptive voltage node, the voltage level being inversely proportional to the current that flows through the inductor so as to decrease a variation of the amount of time to turn off the first switch wherein the first switch is a power metal oxide field effect transistor (MOSFET).

2. The DC-to-DC converter of claim 1 wherein one of the two transistors is connected to the adaptive voltage node, and the value of the conductive resistance of such transistor varies accordingly with the voltage level at the adaptive voltage node.

3. The DC-to-DC converter of claim 1 wherein the voltage drop between the gate and source terminals of the first switch varies with the current that flows through the inductor.

4. The DC-to-DC converter of claim 1 wherein the driver includes a constant voltage node, a resistor connected to the constant voltage node, wherein the constant voltage node and the resistor are configured to provide the voltage level at the adaptive voltage node according to current that flows through the constant voltage node and the resistor, wherein Vadp=Vcst−Isns*R, where Vadp is the adaptive voltage, Vcst is the constant voltage and Isns is the sensed inductor current.

5. The DC-to-DC converter of claim 4 wherein the driver further comprises two switches controllable to be on and off simultaneously, the two switches, if on, couple to the constant voltage node, and, if off, couple to the adaptive voltage node.

6. The DC-to-DC converter of claim 1 wherein the driver is configured to receive a pulse width modulated (PWM) signal that is used to alternately turn on and off the first and second switches.

7. A method, comprising:
 turning off a switch of a DC-to-DC converter so as to decrease current flowing through an inductor coupled to an input voltage node and the switch;
 based on the current flowing through the inductor, providing a voltage level at an adaptive voltage node being inversely proportional to the current flowing through the inductor; and
 based on the voltage level at the adaptive voltage node, determining the amount of time to turn off the switch, wherein determining the amount of time to turn off the switch is further based on a value of a conductive resistance for a transistor coupled to the switch and the adaptive voltage node and wherein the value of the conductive resistance for the transistor changes in accordance with the current flowing through the inductor.

* * * * *